(12) United States Patent
Campbell et al.

(10) Patent No.: US 12,306,229 B2
(45) Date of Patent: May 20, 2025

(54) TIME-DOMAIN REFLECTOMETRY PROTOCOL FOR SENSORS

(71) Applicant: International Business Machines Corporation, Armonk, NY (US)

(72) Inventors: Eric J. Campbell, Rochester, MN (US); Christopher Steffen, Rochester, MN (US); Chad Albertson, Rochester, MN (US); Nicholas Ollerich, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/808,163

(22) Filed: Jun. 22, 2022

(65) Prior Publication Data
US 2022/0326287 A1   Oct. 13, 2022

Related U.S. Application Data

(62) Division of application No. 16/564,604, filed on Sep. 9, 2019, now Pat. No. 11,402,418.

(51) Int. Cl.
*G01R 27/06* (2006.01)
*G01R 27/02* (2006.01)
(52) U.S. Cl.
CPC .............. *G01R 27/06* (2013.01); *G01R 27/02* (2013.01)
(58) Field of Classification Search
CPC ................................ G01R 27/02; G01R 27/06
See application file for complete search history.

(56) References Cited

U.S. PATENT DOCUMENTS

| | | | |
|---|---|---|---|
| 4,766,386 A * | 8/1988 | Oliver | G01R 31/11 324/533 |
| 5,361,776 A | 11/1994 | Samuelson et al. | |
| 6,285,195 B1 * | 9/2001 | Needle | G01R 35/005 324/750.02 |
| 7,134,101 B2 | 11/2006 | Liaw et al. | |
| 7,283,594 B1 | 10/2007 | Wood | |
| 9,513,321 B2 | 12/2016 | Frangen | |
| 10,073,074 B1 | 9/2018 | Kumar et al. | |
| 10,765,109 B1 | 9/2020 | Dev et al. | |
| 2009/0030644 A1 * | 1/2009 | Johns | G01K 7/015 702/130 |
| 2009/0157930 A1 | 6/2009 | Kuo | |

(Continued)

FOREIGN PATENT DOCUMENTS

GB        2458653 B    11/2012

OTHER PUBLICATIONS

Habib et al., "Internet-of-things based Smart Tracking", 2017 International Conference on Communication, Computing and Digital Systems (C-CODE), pp. 44-47, 2017.

(Continued)

*Primary Examiner* — Reena Aurora
(74) *Attorney, Agent, or Firm* — Jeffrey M. Ingalls

(57) ABSTRACT

Provided is a method for collecting sensor data using time-domain reflectometry (TDR). A primary device transmits a TDR signal to a first sensor. A reflected signal is received in response to the transmitted TDR signal. The reflected signal is analyzed to determine an impedance of the first sensor. Based on the impedance of the first sensor, a sensor value for the first sensor is determined.

20 Claims, 6 Drawing Sheets

(56) References Cited

U.S. PATENT DOCUMENTS

| | | | |
|---|---|---|---|
| 2012/0032612 A1* | 2/2012 | Antony | H05B 45/56 |
| | | | 315/297 |
| 2012/0206281 A1 | 8/2012 | Bashirullah et al. | |
| 2014/0249711 A1 | 9/2014 | Hanson et al. | |
| 2016/0018252 A1 | 1/2016 | Hanson et al. | |
| 2016/0127135 A1 | 5/2016 | Balasubramanian | |
| 2016/0198465 A1 | 7/2016 | Britt et al. | |
| 2016/0231721 A1 | 8/2016 | Lakshmanan et al. | |
| 2017/0023632 A1 | 1/2017 | Johnson et al. | |
| 2017/0169867 A1* | 6/2017 | Desai | G11C 7/106 |
| 2019/0001828 A1* | 1/2019 | Ko | H01M 10/6571 |
| 2019/0202346 A1 | 7/2019 | Shipman | |
| 2021/0072296 A1 | 3/2021 | Campbell et al. | |
| 2022/0250380 A1* | 8/2022 | Seike | B41J 2/04568 |

OTHER PUBLICATIONS

List of IBM Patents or Patent Applications Treated as Related, Jun. 22, 2022, 2 pgs.

\* cited by examiner

TIME-DOMAIN REFLECTOMETRY PROTOCOL FOR SENSORS

BACKGROUND

The present disclosure relates generally to the field of electronic sensors, and more particularly to collecting sensor data from sensors using time-domain reflectometry.

The internet of things (IoT) is a system of interrelated computing devices, machines, objects, animals, and/or people that transfer data over a network without requiring human-to-human or human-to-computer interaction. IoT technology includes "smart" devices (e.g., lighting fixtures, thermostats, home security systems and cameras, and other home appliances) that support a common ecosystem, and can be controlled via devices associated with that ecosystem, such as smartphones. The common ecosystem may include electronic sensors. The electronic sensor may transmit collected data back to a controller that monitors and controls the various smart devices.

SUMMARY

Embodiments of the present disclosure include a method, computer program product, and system for collecting sensor data using time-domain reflectometry (TDR). A primary device transmits a TDR signal to a first sensor. A reflected signal is received in response to the transmitted TDR signal. The reflected signal is analyzed to determine an impedance of the first sensor. Based on the impedance of the first sensor, a sensor value for the first sensor is determined.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

Figure 1:
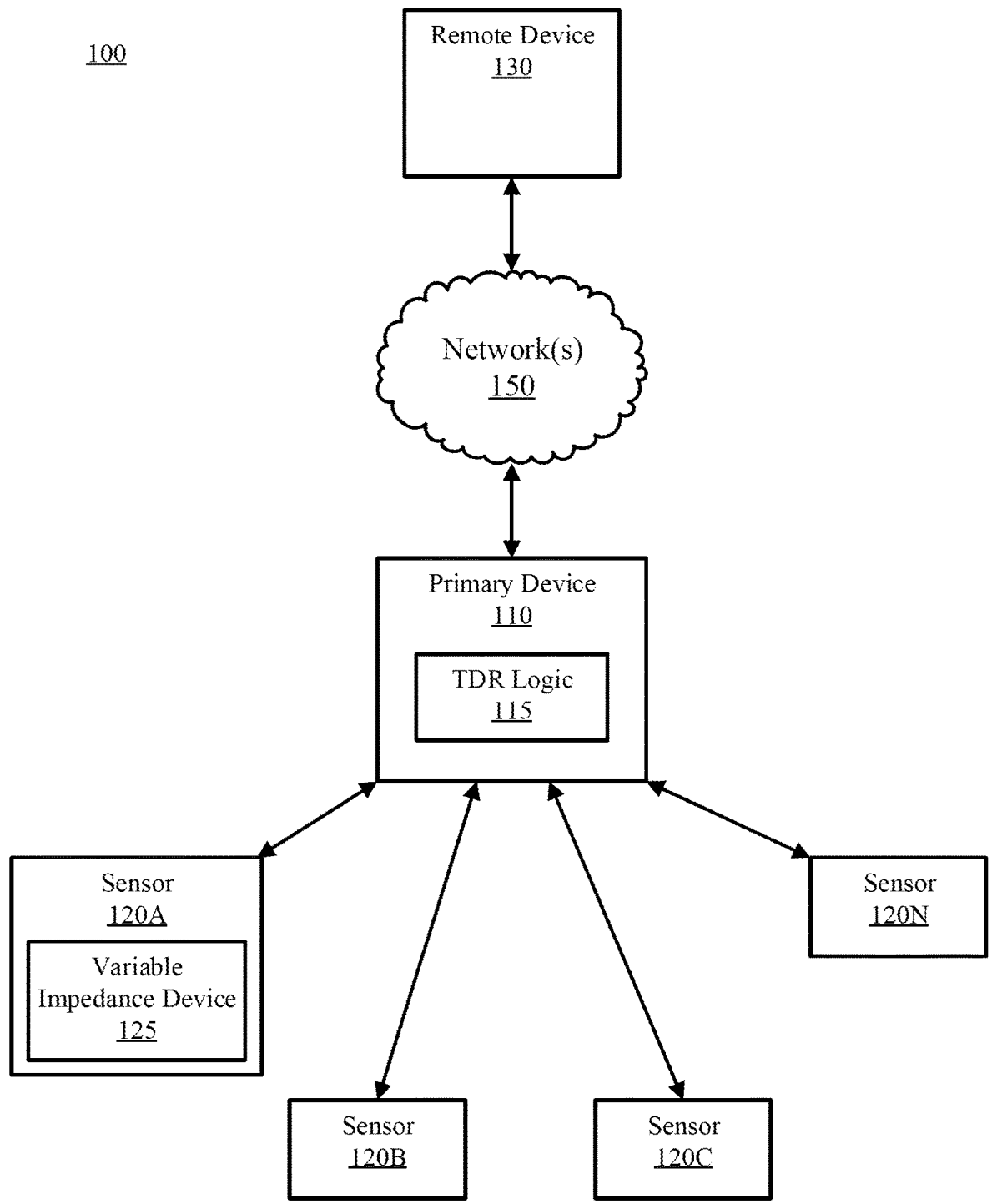
FIG. 1 illustrates a block diagram of an example system for collecting sensor data using time-domain reflectometry, in accordance with embodiments of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the invention.

DETAILED DESCRIPTION

Aspects of the present disclosure relate generally to the field of electronic sensors, and in particular to collecting sensor data from sensors using time-domain reflectometry. While the present disclosure is not necessarily limited to such applications, various aspects of the disclosure may be appreciated through a discussion of various examples using this context.

Time-domain reflectometry (TDR) is a measurement technique used to determine the characteristics of electrical lines by observing reflected signals. The impedance of a discontinuity can be determined from the amplitude of the reflected signal. A time-domain reflectometer is a device that measures characteristics of reflections along a conductor. In order to measure those reflections, the time-domain reflectometer will transmit an incident signal onto the conductor and listen for its reflections. If the conductor is of a uniform impedance and is properly terminated, then there will be no reflections and the remaining incident signal will be absorbed at the far-end by the termination. However, if there are impedance variations, then some of the incident signal will be reflected back to the source.

For example, if a pure resistive load is placed on the output of a time-domain reflectometer and a step signal is applied, a step signal is also reflected, and the amplitude of the reflected signal is a function of the resistive load. The magnitude of the reflection p produced by the resistive load $R_L$ may be expressed as a fraction of the input signal as given by:

$$\rho = \frac{R_L - Z_0}{R_L + Z_0}$$

where $Z_0$ is the characteristic impedance of the transmission line.

Generally, the reflections will have the same shape as the incident signal, but their sign and magnitude depend on the change in impedance level. If there is a step increase in the impedance, then the reflection will have the same sign as the incident signal; if there is a step decrease in impedance, the reflection will have the opposite sign. The magnitude of the reflection depends not only on the amount of the impedance change, but also upon the loss in the conductor.

Internet of Things (IoT) devices and sensors require data transmission between a secondary device (also referred to as a worker device, e.g., an IoT sensor) and a primary device (sometimes referred to as a boss device, e.g., a PC, controller, etc.). Most IoT sensors are primarily used to only send data back to the controller, as opposed to processing the data within the sensor. In order to transmit the data, IoT sensors currently need to have a transmitter incorporated into the device. Additionally, current wired IoT sensors rely on standard uni-directional or bi-directional signaling (I2C, SPI, etc.), all of which require drivers/receivers on both the controller and the sensor. The inclusion of a transmitter in each sensor increases both the form factor of the sensor and the power consumption of the sensor.

Embodiments of the present disclosure include a method to transmit sensor data utilizing time-domain reflectometry (TDR) and programmable resistors. These embodiments enable removing the transmitter from the sensor, thereby reducing the power consumption of the sensor and allowing for smaller form factor sensors. Embodiments include placing TDR logic on the controller. The TDR logic samples steady state voltage levels of the sensor to determine the impedance of the sensor. This impedance number can be quantified into data bits that correspond to a sensor value. By sampling steady state voltage at low frequencies (e.g., lower frequency than the frequency of reflection), further in time than the reflections, consistent results can be achieved. The collection frequency may depend on the wire, and it may be on the scale of nanoseconds in some embodiments. Using a clock/chip select from the controller, the controller can gather multiple bits of data.

Some embodiments of the present disclosure include a primary device (e.g., a controller, a computer, etc.) configured to send a communication to a sensor (e.g., an IoT temperature sensor). The communication includes a clock and a data signal. The selected sensor communicates to the primary device by changing the resistance of a selectable resistor ladder (e.g., a digital potentiometer) such that a reflected TDR signal on the data line will have a particular waveform. Over multiple such communications, many bits of information can be transmitted from the sensor to the primary device without the use of a transmitter on the sensor.

In some embodiments, the controller will consume more power due to the added TDR logic. Moving the power to the controller instead of the sensor is advantageous if, for example, the sensor is configured to operate at very low power or if multiple sensors are connected, whereby the power savings of all of the sensors would be larger than the increased power usage of the controller, resulting in an overall system power savings. If multiple sensors are connected to the link (e.g., daisy chained), the sensors that are not selected (e.g., via chip select) will be put into a high impedance state. This eliminates contention between sensor devices and allows the controller to collect data from the relevant sensor.

Any type of sensor that is electrically coupled to a primary device may be used. Sensors that do not require constant feedback (e.g., continuous monitoring) are particularly well adapted, though other types of sensors can still benefit from embodiments of the present disclosure and the disclosure is not limited to any specific type of sensors. Example sensors that may incorporate aspects of the present disclosure include, but are not limited to, humidity sensors, temperature sensors, and pressure sensors.

It is to be understood that the aforementioned advantages are example advantages and should not be construed as limiting. Embodiments of the present disclosure can contain all, some, or none of the aforementioned advantages while remaining within the spirit and scope of the present disclosure.

Turning now to the figures, FIG. 1 illustrates a block diagram of an example system 100 for collecting sensor data using time-domain reflectometry, in accordance with embodiments of the present disclosure. The system includes a primary device 110 (e.g., a controller or computer) communicatively coupled to a plurality of sensors 120A, 120B, 120C, 120N (individually or collectively referred to herein as sensor(s) 120). The primary device 110 is connected to each sensor 120 using one or more physical, electrical connections (e.g., a wire).

The primary device 110 includes TDR logic 115. The TDR logic 115 is configured to periodically transmit a signal to a sensor 120 and sample steady-state voltage levels of the reflection to determine an impedance of the sensor 120. The primary device 110 then converts the measured impedance into data bits that correspond to a value measured by the sensor. For example, if the sensor is a temperature sensor, the measured impedance can be converted into a temperature value. The TDR logic 115 may collect data from the sensor according to, for example, a clock (e.g., collect the information every 10 minutes), in response to a command from an application running on the primary device 110, and/or in response to a command from the remote device 130.

The sensors 120 include a variable impedance devices (e.g., variable impedance device 125). The sensors 120 are configured to change the impedance of their variable impedance device 125 based on a measured value (referred to herein as a "sensor value"). For example, a temperature sensor would change the impedance based on the measured temperature, whereas a barometric sensor would change the impedance based on the measured pressure. The variable impedance device 125 can be any device where the impedance can be changed, including, without limitation, a resistor ladder (e.g., in a digital potentiometer) and/or a variable resistor (e.g., a potentiometer).

In some embodiments, the sensor 120 is configured to update its impedance periodically. For example, one or more clocks on the sensor 120 may dictate when the sensor takes a measurement (e.g., a temperature sensor collects temperature data, a humidity sensor collects humidity data, etc.). Based on the collected data (i.e., the sensor value), the sensor 120 may alter the impedance of the variable impedance device 125. For example, if the sensor 120 is a temperature sensor that determines, at a falling edge of a clock cycle, that the temperature is 25° C., the sensor 120 may set the variable impedance device 125 to a corresponding impedance level (e.g., resistance). In this way, the sensors 120 may be configured to periodically "wake up," collect a measurement, adjust their impedance, and return to a low power state. The primary device 110 may then ping a sensor 120 for its most recent data, even if the sensor 120 is in a low power state, and determine the data from the reflected waveform.

In some embodiments, the sensors 120 may be configured to update their stored data in response to instruction from the primary device 110. For example, a clock signal of the primary device 110 may cause the sensors 120 to collect a measurement and change their impedance to correspond to the measurement. In some embodiments, the primary device 110 may be configured to send an update signal to one or more sensors 120 whenever it needs updated data from the sensors 120. The update signal may cause the sensors 120 to update their impedance based on current measurement data, and the primary device 110 may then determine the sensor value (e.g., temperature) using TDR.

In some embodiments, the primary device 110 is configured to manage a set of (e.g., one or more) sensors 120, collect the measurement data from the sensors 120, and transmit the data back to a remote device 130 (e.g., a computer/server). For example, the primary device 110 may control/manage all of the sensors in a particular room, and then transmit the measurement data back to the remote device 130.

The primary device 110 and the remote device 130 may be distant from each other and communicate over a network 150. In some embodiments, the remote device 130 may act as a central hub from which the primary device 110 can establish a communication connection, such as in a client-server networking model. Alternatively, the primary device 110 and the remote device 130 may be configured in any other suitable networking relationship (e.g., in a peer-to-peer configuration or using any other network topology).

In some embodiments, the network 150 can be implemented using any number of any suitable communications media. For example, the network 150 may be a wide area network (WAN), a local area network (LAN), an internet, or an intranet. In certain embodiments, the primary device 110 and the remote device 130 may be local to each other and communicate via any appropriate local communication medium. For example, the primary device 110 and the remote device 130 may communicate using a local area network (LAN), one or more hardwire connections, a wireless link or router, or an intranet. In some embodiments, the system 100 may include numerous primary devices 110, and the primary devices 110 and the remote device 130 may be communicatively coupled using a combination of one or more networks and/or one or more local connections. For example, a first primary device 110 may be hardwired to the remote device 130 (e.g., connected with an Ethernet cable) while a second primary device 110, which manages a second set of sensors, may communicate with the remote device 130 using the network 150 (e.g., over the Internet).

In some embodiments, the network 150 may be a telecommunication network. The telecommunication network may include one or more cellular communication towers, which may be a fixed-location transceiver that wirelessly communicates directly with a mobile communication terminal (e.g., remote device 130). The wireless communications links may include, for example, shortwave, high frequency, ultra-high frequency, microwave, wireless fidelity (Wi-Fi), Bluetooth technology, global system for mobile communications (GSM), code division multiple access (CDMA), second-generation (2G), third-generation (3G), fourth-generation (4G), fifth-generation (5G), or any other wireless communication technology or standard to establish a wireless communications link.

In some embodiments, the network 150 can be implemented within a cloud computing environment, or using one or more cloud computing services. Consistent with various embodiments, a cloud computing environment may include a network-based, distributed data processing system that provides one or more cloud computing services. Further, a cloud computing environment may include many computers (e.g., hundreds or thousands of computers or more) disposed within one or more data centers and configured to share resources over the network 150.

Figure 2:
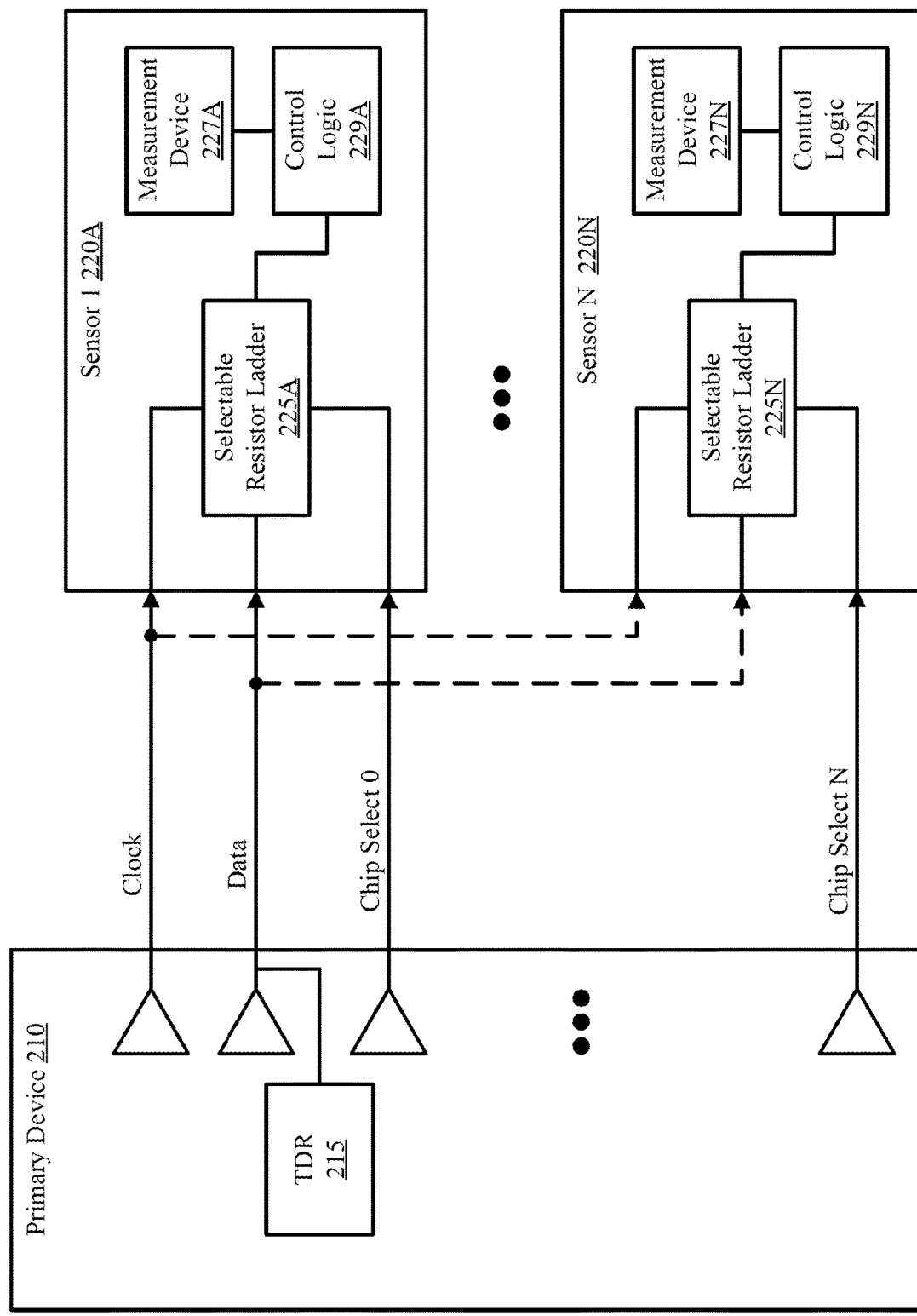
FIG. 2 illustrates a circuit diagram of an example time-domain reflectometry sensor system, in accordance with embodiments of the present disclosure.

Referring now to FIG. 2, illustrated is a circuit diagram of an example time-domain reflectometry sensor system 200, in accordance with embodiments of the present disclosure. The sensor system 200 includes a primary device 210 electrically connected to a plurality of sensors 220A, 220N (individually or collectively referred to as sensor(s) 220). The primary device 210 includes TDR logic 215, and each sensor 220 includes a selectable resistor ladder 225A, 225N (individually or collectively referred to as resistor ladder(s) 225).

The primary device 210 is electrically connected to each sensor 220 using three connections: a clock line, a data line, and a chip select line. The TDR logic 215 is connected to the data line, and it is configured to output a signal on the data line and listen for a reflection. The TDR logic 215 is further configured to convert the reflected signal, which indicates an impedance of the selectable resistor ladder 225, into an associated sensor value (e.g., a temperature value, a humidity value, etc.).

The primary device 210 uses the chip select line to select which sensor it wants the data from. A selected sensor (e.g., sensor 1 220A) will receive a first signal on its chip select line (e.g., a low signal in the event that the device operates as an "active low" device), whereas the remaining sensors (e.g., sensor N 220N) will receive a second signal on their chip select lines. In order to prevent contention between the various sensors 220, all sensors 220 that are not selected via the chip select are placed in a high impedance state. This ensures that the TDR logic 215 is able to analyze the reflection from the selected sensor 220 without interference from the other sensors.

In some embodiments, unlike the data line, which may be shared by each of the sensors 220, the primary device 210 has a separate chip select line for each sensor. The separate chip select lines may be selected using a binary decoder chip. For example, a 3-input, 8-output binary decoder chip may have eight chip select lines which may be selected using the three inputs. In some embodiments, the primary device 210 may include one or more multiplexers or demultiplexers for selecting the sensor or for receiving the reflected signal. The multiplexers and/or demultiplexers may be in addition to, or instead of, a set of dedicated (e.g., one per sensor) chip select lines and a shared data line.

In addition to the resistor ladder 225, the sensors 220 may include measurement devices 227A, 227N (individually or collectively referred to as measurement device(s) 227) and control logic 229A, 229N (individually or collectively referred to as control logic 229). The measurement devices 227 (e.g., probes) may include any device for collecting data. For example, if the sensor is a temperature sensor, the measurement device may be a thermocouple. The output of the measurement devices 227 may be fed into the control logic 229, which may be configured to adjust the effective resistance of the selectable resistor ladder 225. For example, the control logic 229 may determine a corresponding resistance based on the collected measurement data, and set the selectable resistor ladder 225 to that resistance.

The selectable resistor ladders 225 may be any size (e.g., any number of bits), and the size of the selectable resistor ladders 225 may differ from each other (e.g., depending on the type of sensor). For example, the first selectable resistor ladder 225A may be a 4-bit resistor ladder if the first sensor 220A only needs a 4-bit granularity (e.g., if the sensor is configured to return less than 16 different data amounts), whereas the second selectable resistor ladder 225N may be an 8-bit resistor ladder if the other sensor 220N needs to be able to return a byte of data per pull.

In some embodiments, the sensors 220 may include one or more clocks. These one or more clock may be internal clocks, external (e.g., connected to the primary device 210), or a combination of both. The sensors 220 may utilize the clocks to trigger data sampling (e.g., using the measurement device 227) and updating the selectable resistor ladder 225. For example, the sensors 220 may be configured to update their resistances periodically based on the clock, such as once every 100 clock cycles. When not updating, the sensors 220 may be in a low power state with the value of the last reading stored in the selectable resistor ladders 225. Once the next clock trigger occurs, the sensors 220 may wake up, sample new data, update their selectable resistor ladders 225, and return to a low power state.

In some embodiments, the clock can be used to return more bits of information than can fit at one time on the resistor ladder. For example, assume that the resistor ladder 225 is capable of storing 8 bits of data, but the primary device 210 wants 16 bits of precision. The sensor 220 may store the first 8 bits (e.g., most significant bits) in the resistor ladder. The primary device 210 can read the 8 most significant bits using the TDR data and chip select. Then, the primary device 210 could send a clock pulse to the sensor 220, which would cause the sensor 220 to load 8 more bits (e.g., the least significant bits) from the same senor reading into the resistor ladder 225. This would allow the primary device 210 to read a combined 16 bits of data from an 8-bit resistor ladder (data register).

Figure 3:
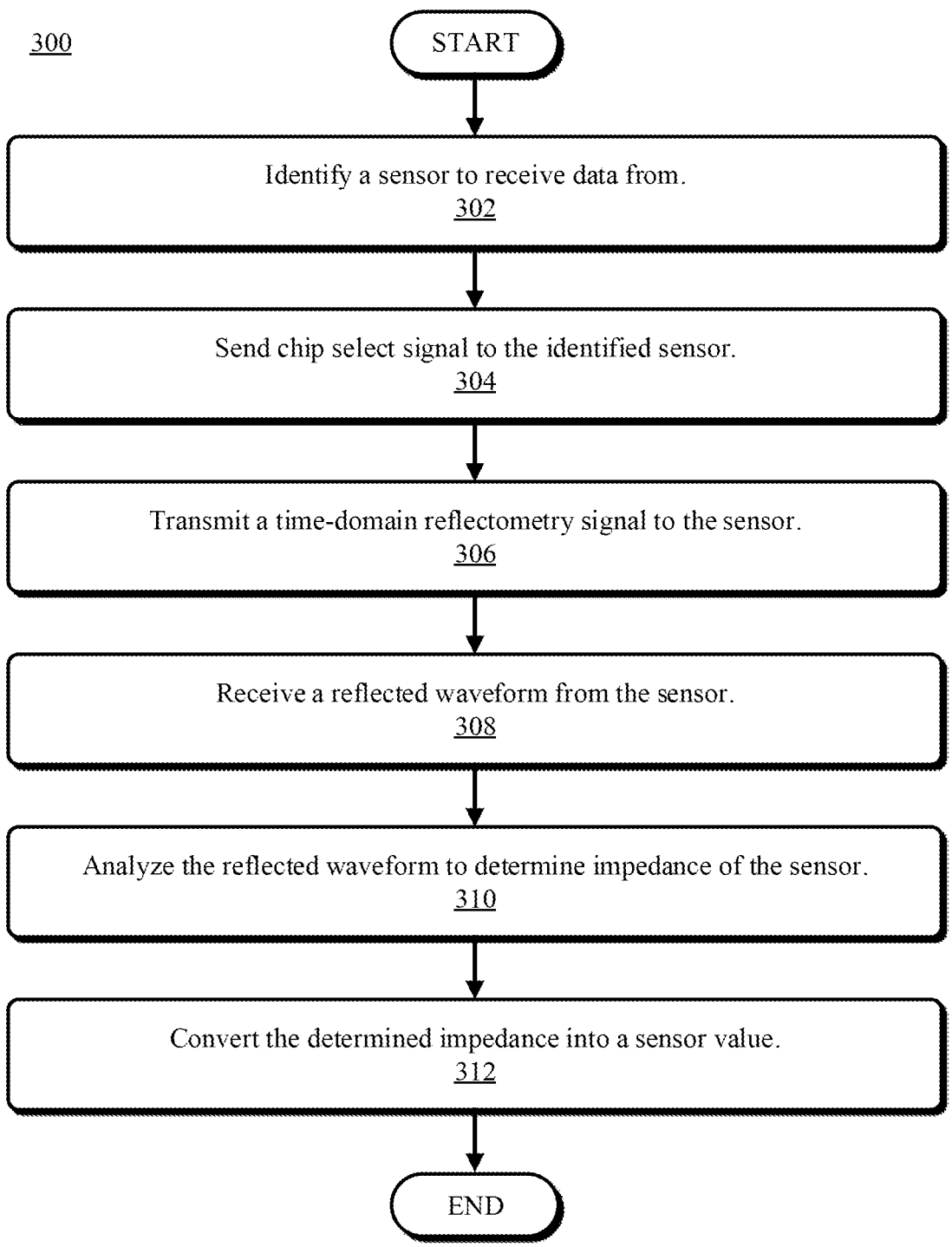
FIG. 3 illustrates a flowchart of an example method for collecting sensor data using time-domain reflectometry, in accordance with embodiments of the present disclosure.

Referring now to FIG. 3, illustrated is a flowchart of an example method 300 for collecting sensor data using time-domain reflectometry, in accordance with embodiments of the present disclosure. The method 300 may be performed by hardware, firmware, software executing on a processor, or any combination thereof. For example, the method 300 may be performed by a primary device (e.g., a controller, a computer) that is configured to read data from one or more secondary devices (e.g., sensors) to which the primary device is electrically connected (e.g., using wires). The method 300 may begin at operation 302, wherein the primary device identifies a sensor from which to read data.

In some embodiments, a computer application may determine which sensor from a plurality of sensors to pull data from. This may be in response to user input, automatically as a result of execution of computer program code, or in response to an event (e.g., an alert). After identifying the sensor to receive data from, a chip select signal may be sent to the sensor at operation 304. The chip select signal may identify which sensor is being read and which sensors are not being read.

At operation 306, a time-domain reflectometry signal may be sent to the sensor. The TDR signal may be sent along a data line to each of the sensors. The TDR signal may be generated by the primary device, and may include any waveform (e.g., a step signal). In some embodiments, a multiplexer (or demultiplexer) may be used to selectively send the TDR signal to the selected sensor. In some embodiments, there may be a delay between transmission of the chip select signal and the TDR signal. This may be done in order for the sensors to place themselves in the proper state (e.g., a high impedance state for sensors that were not selected) so that their impedance does not affect the reflected waveform.

At operation 308, a reflected waveform may be received from the sensor. The reflected waveform may be received on the data line as a result of the transmitted TDR signal. At operation 310, the reflected waveform may be analyzed to determine the impedance of the sensor. Analyzing the reflected waveform may include determining characteristics of the reflected waveform, such as its amplitude. Based on the analysis, and using knowledge of the characters of the TDR signal that was sent, the primary device may calculate the impedance of the sensor.

At operation 312, the impedance of the sensor may be converted into a sensor value. The impedance value from the TDR waveform will be converted from an analog signal into a binary representation. This binary value will then be used to represent the data gathered from the sensor. For example, if the sensor is a temperature sensor, the impedance of the sensor may be converted into a temperature value. The impedance may be converted using a conversion table or conversion logic (e.g., a function). After converting the impedance into a sensor value at operation 312, the method 300 may end.

In some embodiments, after converting the impedance into a sensor value, the primary device may transmit the sensor value to another device (e.g., a remote device). For example, the primary device may be a controller configured to manage a set of sensors. The controller may be coupled to another device, such as a smart phone, and the controller may transmit the sensor value to the smart phone.

Figure 4:
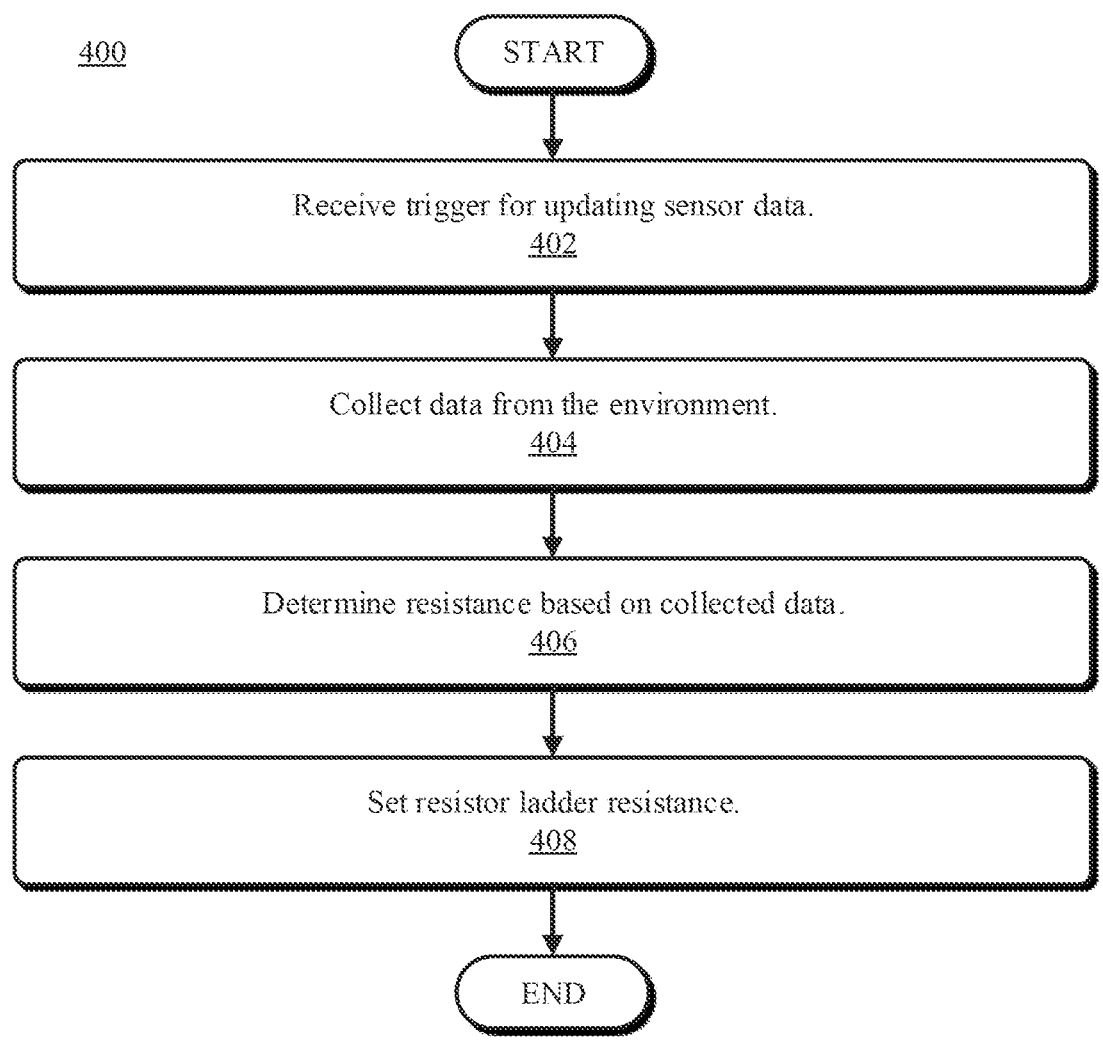
FIG. 4 illustrates a flowchart of an example method for updating and storing sensor data using a resistor ladder, in accordance with embodiments of the present disclosure

Referring now to FIG. 4, illustrated is a flowchart of an example method 400 for updating and storing sensor data using a resistor ladder, in accordance with embodiments of the present disclosure. The method 400 may be performed by hardware, firmware, software executing on a processor, or any combination thereof. For example, the method 400 may be performed by a secondary device (e.g., a sensor) that is configured to provide data to a primary device (e.g., a controller, a computer) using time-domain reflectometry. The method 400 may begin at operation 402, wherein the sensor receives an update trigger.

The update trigger may be any signal that causes the sensor to update its sensor value. The update trigger may be received from an external source (e.g., from the primary device). For example, a clock signal of the primary device may be connected to the sensor, and the sensor may be configured to update its sensor value periodically based on the clock (e.g., every 10 clock cycles). In some embodiments, the update trigger is based on an internal signal, such as an internal clock signal.

At operation 404, in response to receiving the update trigger, the sensor collects data from the environment. For example, if the sensor is a humidity sensor, it will collect humidity data using one or more measurement devices. At operation 406, a resistance that corresponds to the collected data is determined. At operation 408, the sensor updates its resistor ladder to set it to the resistance that corresponds to the collected data (e.g., to the sensor value).

Figure 5:
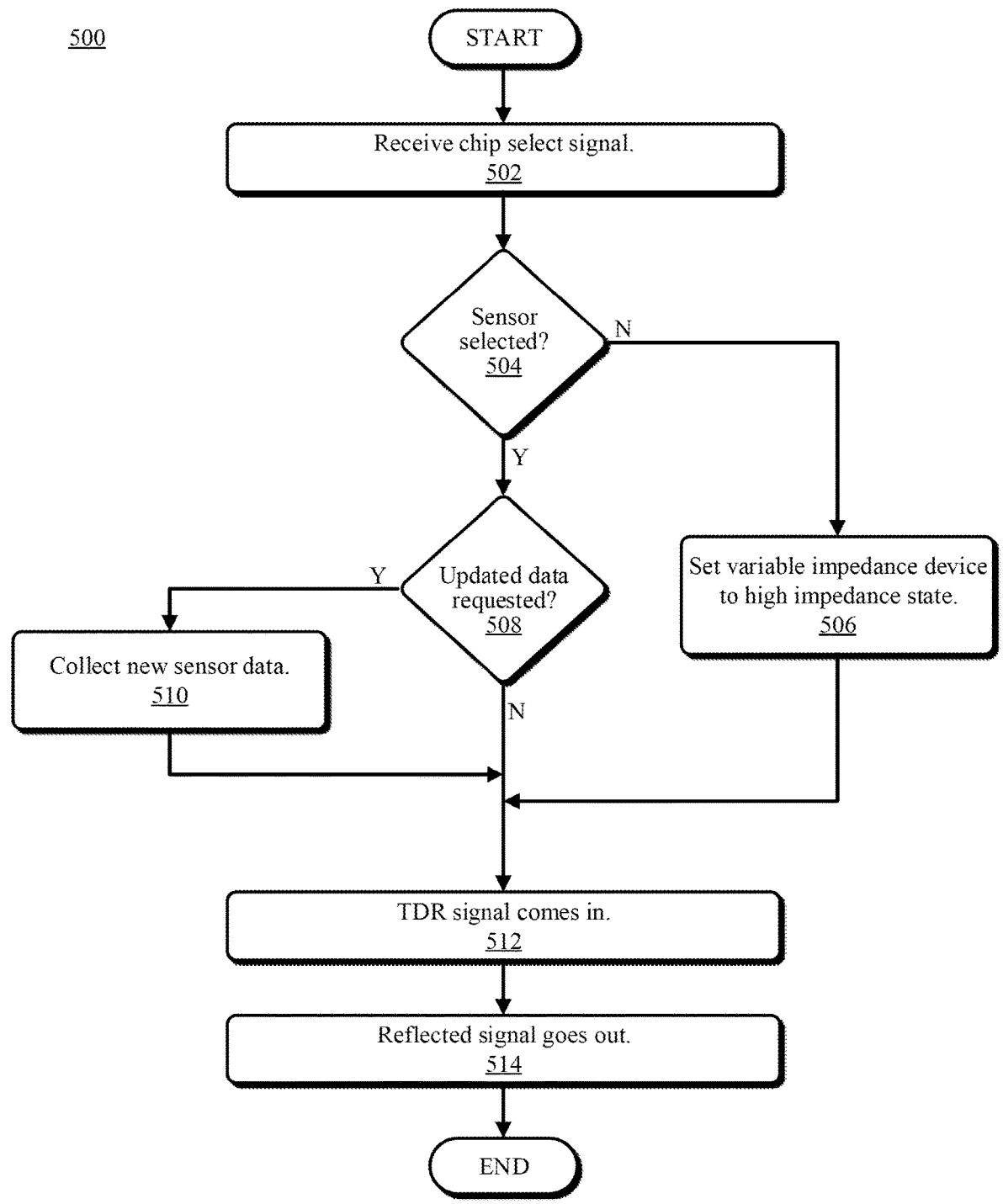
FIG. 5 illustrates a flowchart of an example method for responding to a request for sensor data, in accordance with embodiments of the present disclosure.

Referring now to FIG. 5, illustrated is a flowchart of an example method 500 for responding to a request for sensor data, in accordance with embodiments of the present disclosure. The method 500 may be performed by hardware, firmware, software executing on a processor, or any combination thereof. For example, the method 500 may be performed by a secondary device (e.g., a sensor) that is configured to provide data to a primary device (e.g., a controller, a computer) using time-domain reflectometry. The method 500 may begin at operation 502, wherein a sensor receives a chip select signal from a primary device.

At decision block 504, the sensor determines if it is selected based on the chip select signal. If the sensor is not selected, a variable impedance device of the sensor is set to a high impedance state at operation 506. The unselected sensor(s) may return to its previous value after a period of time, or in response to receiving a signal (e.g., a reset signal, the chip select changes, or after the TDR signal has been reflected).

If the sensor is selected, the sensor determines whether updated sensor data is requested at decision block 508. In some embodiments, the sensor is configured to always update its data in response to receiving the chip select signal indicating that the sensor is selected. In other embodiments, the sensor may be configured to update its data only when an update signal is received. If the sensor determines that updated data is requested, the sensor collects new sensor data at operation 510. Collecting new sensor data may be performed substantially as described in method 400 of FIG. 4.

At operation 512, a TDR signal may be received by the sensor (e.g., come in) on a data line. The TDR signal may be sent by the primary device. At operation 514, as a result of the TDR signal and an impedance of the sensor, the TDR signal may be reflected, and a reflected waveform may return to the primary device on the data line, and the method 500 may end.

It is to be understood that various operations described herein may happen automatically, and not as a result of any hardware/software logic on the sensor. For example, operations 512 and 514 may happen automatically as a result of a primary device sending a TDR signal to the sensor, and the sensor may not perform any action to cause either operation.

Figure 6:
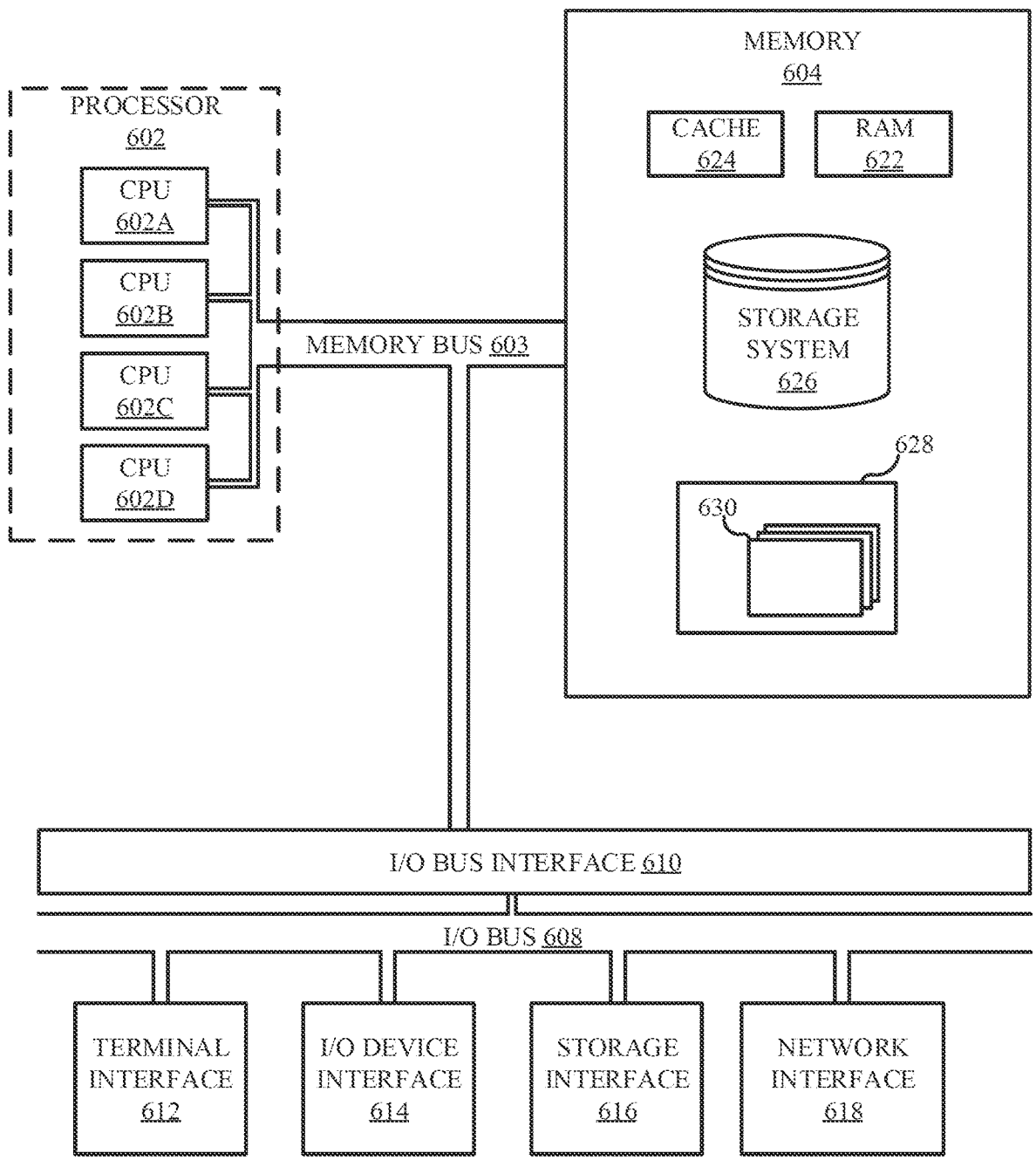
FIG. 6 illustrates a high-level block diagram of an example computer system that may be used in implementing one or more of the methods, tools, and modules, and any related functions, described herein, in accordance with embodiments of the present disclosure.

Referring now to FIG. 6, shown is a high-level block diagram of an example computer system 601 that may be used in implementing one or more of the methods, tools, and modules, and any related functions, described herein (e.g., using one or more processor circuits or computer processors of the computer), in accordance with embodiments of the present disclosure. In some embodiments, the major components of the computer system 601 may comprise one or more CPUs 602, a memory subsystem 604, a terminal interface 612, a storage interface 616, an I/O (Input/Output) device interface 614, and a network interface 618, all of which may be communicatively coupled, directly or indirectly, for inter-component communication via a memory bus 603, an I/O bus 608, and an I/O bus interface unit 610.

The computer system 601 may contain one or more general-purpose programmable central processing units (CPUs) 602A, 602B, 602C, and 602D, herein generically referred to as the CPU 602. In some embodiments, the computer system 601 may contain multiple processors typical of a relatively large system; however, in other embodiments the computer system 601 may alternatively be a single CPU system. Each CPU 602 may execute instructions stored in the memory subsystem 604 and may include one or more levels of on-board cache.

System memory 604 may include computer system readable media in the form of volatile memory, such as random access memory (RAM) 622 or cache memory 624. Computer system 601 may further include other removable/non-removable, volatile/non-volatile computer system storage media. By way of example only, storage system 626 can be provided for reading from and writing to a non-removable, non-volatile magnetic media, such as a "hard drive." Although not shown, a magnetic disk drive for reading from and writing to a removable, non-volatile magnetic disk (e.g., a "floppy disk"), or an optical disk drive for reading from or writing to a removable, non-volatile optical disc such as a CD-ROM, DVD-ROM or other optical media can be provided. In addition, memory 604 can include flash memory, e.g., a flash memory stick drive or a flash drive. Memory devices can be connected to memory bus 603 by one or more data media interfaces. The memory 604 may include at least one program product having a set (e.g., at least one) of program modules that are configured to carry out the functions of various embodiments.

One or more programs/utilities 628, each having at least one set of program modules 630 may be stored in memory 604. The programs/utilities 628 may include a hypervisor (also referred to as a virtual machine monitor), one or more operating systems, one or more application programs, other program modules, and program data. Each of the operating systems, one or more application programs, other program modules, and program data or some combination thereof, may include an implementation of a networking environment. Program modules 630 generally perform the functions or methodologies of various embodiments.

Although the memory bus 603 is shown in FIG. 6 as a single bus structure providing a direct communication path among the CPUs 602, the memory subsystem 604, and the I/O bus interface 610, the memory bus 603 may, in some embodiments, include multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 610 and the I/O bus 608 are shown as single respective units, the computer system 601 may, in some embodiments, contain multiple I/O bus interface units 610, multiple I/O buses 608, or both. Further, while multiple I/O interface units are shown, which separate the I/O bus 608 from various communications paths running to the various I/O devices, in other embodiments some or all of the I/O devices may be connected directly to one or more system I/O buses.

In some embodiments, the computer system 601 may be a multi-user mainframe computer system, a single-user system, or a server computer or similar device that has little or no direct user interface, but receives requests from other computer systems (clients). Further, in some embodiments, the computer system 601 may be implemented as a desktop computer, portable computer, laptop or notebook computer, tablet computer, pocket computer, telephone, smart phone, network switches or routers, or any other appropriate type of electronic device.

It is noted that FIG. 6 is intended to depict the representative major components of an exemplary computer system 601. In some embodiments, however, individual components may have greater or lesser complexity than as represented in FIG. 6, components other than or in addition to those shown in FIG. 6 may be present, and the number, type, and configuration of such components may vary.

In addition to embodiments described above, other embodiments having fewer operational steps, more operational steps, or different operational steps are contemplated. Also, some embodiments may perform some or all of the above operational steps in a different order. Furthermore, multiple operations may occur at the same time or as an internal part of a larger process. The modules are listed and described illustratively according to an embodiment and are not meant to indicate necessity of a particular module or exclusivity of other potential modules (or functions/purposes as applied to a specific module).

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s).

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

As used herein, "a number of" when used with reference to items, means one or more items. For example, "a number of different types of networks" is one or more different types of networks.

When different reference numbers comprise a common number followed by differing letters (e.g., 100a, 100b, 100c) or punctuation followed by differing numbers (e.g., 100-1, 100-2, or 100.1, 100.2), use of the reference character only without the letter or following numbers (e.g., 100) may refer to the group of elements as a whole, any subset of the group, or an example specimen of the group.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to the skilled in the art. Therefore, it is intended that the following claims be interpreted as covering all such alterations and modifications as fall within the true spirit and scope of the invention.

What is claimed is:

1. A method comprising:
   receiving, by a sensor, a signal from a time-domain reflectometer connected to the sensor, the sensor including a measuring device, a variable impedance device, and processing logic;
   collecting, by the processing logic in the sensor, measurement data using a measurement device in the sensor, the measurement data including a sensor value generated in response to the receiving of the signal from the time-domain reflectometer;
   determining, by the processing logic, an impedance value that is associated with a collected sensor value; and
   setting, by the processing logic, the variable impedance device in the sensor to the impedance value to store the collected sensor value in the sensor.

2. The method of claim 1, wherein sensor is further configured to physically connect to one or more other sensors in a daisy chain configuration.

3. The method of claim 1, wherein the time-domain reflectometer is connected to the sensor and one or more other sensors, the method further comprising:
   receiving, by the processing logic, a chip select signal selecting one of the one or more other sensors;
   determining, by the processing logic, that the chip select signal indicates that the sensor is not selected; and
   setting, by the processing logic, in response to determining that the chip select signal indicates that the sensor is not selected, the variable impedance device to a high impedance state.

4. The method of claim 3, the method further comprising:
   waiting, by the processing logic, after setting the variable impedance device to the high impedance state, a predetermined period of time; and
   setting, by the processing logic, after expiration of the predetermined period of time, the variable impedance device back to the impedance value.

5. The method of claim 3, the method further comprising:
   receiving, by the processing logic, after setting the variable impedance device to the high impedance state, a second signal;
   determining, by the processing logic, based on a type of the second signal, that the sensor is to return to its previous impedance value; and
   setting, by the processing logic, in response to determining that the sensor is to return to its previous impedance value, the variable impedance device back to the impedance value.

6. The method of claim 1, the method further comprising:
   detecting, by the processing logic, an update trigger;
   collecting, by the processing logic, in response to detecting the update trigger, new measurement data using the measurement device;
   determining, by the processing logic, a new impedance value that is associated with the new measurement data; and setting, by the processing logic, the variable impedance device to the new impedance value.

7. The method of claim 1, wherein the collecting is performed in response to an update trigger, and wherein the method further comprises:
 entering, after setting the variable impedance device to the impedance value, by the sensor, a low power state, the sensor being configured to remain in the low power state until receiving a second update trigger.

8. A computer program product comprising a computer readable storage medium having program instructions embodied therewith, the program instructions executable by a processor in a sensor to cause the sensor to perform a method comprising:
 receiving, by the sensor, a signal from a time-domain reflectometer connected to the sensor, the sensor including a measuring device, a variable impedance device, and the processor;
 collecting, by the processor in the sensor, measurement data using a measurement device in the sensor, the measurement data including a sensor value generated in response to the receiving of the signal from the time-domain reflectometer;
 determining an impedance value that is associated with a collected sensor value; and
 storing the sensor value in the sensor by setting the variable impedance device to the impedance value,
 wherein the sensor includes one or more physical connectors configured to enable an electrical coupling of the variable impedance device to the time-domain reflectometer.

9. The computer program product of claim 8, wherein the sensor is further configured to physically connect to one or more other sensors in a daisy chain configuration.

10. The computer program product of claim 9, wherein the method further comprises:
 receiving a chip select signal selecting one of the one or more other sensors;
 determining that the chip select signal indicates that the sensor is not selected; and
 setting, in response to determining that the chip select signal indicates that the sensor is not selected, the variable impedance device to a high impedance state.

11. The computer program product of claim 10, wherein the method further comprises:
 waiting, after setting the variable impedance device to the high impedance state, a predetermined period of time; and
 setting, after expiration of the predetermined period of time, the variable impedance device back to the impedance value.

12. The computer program product of claim 10, wherein the method further comprises:
 receiving, after setting the variable impedance device to the high impedance state, a second signal;
 determining, based on a type of the second signal, that the sensor is to return to its previous impedance value; and
 setting, in response to determining that the sensor is to return to its previous impedance value, the variable impedance device back to the impedance value.

13. The computer program product of claim 8, wherein the method further comprises:
 detecting an update trigger;
 collecting, in response to detecting the update trigger, new measurement data using the measurement device;
 determining a new impedance value that is associated with the new measurement data; and
 setting the variable impedance device to the new impedance value.

14. The computer program product of claim 8, wherein the collecting is performed in response to an update trigger, and wherein the method further comprises:
 entering, after setting the variable impedance device to the impedance value, a low power state, the sensor being configured to remain in the low power state until receiving a second update trigger.

15. A sensor comprising:
 a measurement device;
 a variable impedance device; and
 processing logic configured to perform a method, the method comprising:
  receiving, by the sensor, a signal from a time-domain reflectometer connected to the sensor;
  collecting, by the processing logic in the sensor, measurement data using the measurement device, the measurement data including a sensor value generated in response to the receiving of the signal from the time-domain reflectometer;
  determining, by the processing logic, an impedance value that is associated with the collected sensor value; and
  storing, by the processing logic, the variable impedance device in the sensor to the impedance value to store the collected sensor value in the sensor.

16. The sensor of claim 15, wherein the sensor further comprises at least one physical connection configured to couple the sensor to one or more other sensors in a daisy chain configuration.

17. The sensor of claim 15, wherein the method further comprises:
 receiving a chip select signal selecting a different sensor;
 determining that the chip select signal indicates that the sensor is not selected; and
 setting, in response to determining that the chip select signal indicates that the sensor is not selected, the variable impedance device to a high impedance state.

18. The sensor of claim 17, wherein the method further comprises:
 waiting, after setting the variable impedance device to the high impedance state, a predetermined period of time; and
 setting, after expiration of the predetermined period of time, the variable impedance device back to the impedance value.

19. The sensor of claim 17, wherein the method further comprises:
 receiving, after setting the variable impedance device to the high impedance state, a second signal;
 determining, based on a type of the second signal, that the sensor is to return to its previous impedance value; and
 setting, in response to determining that the sensor is to return to its previous impedance value, the variable impedance device back to the impedance value.

20. The sensor of claim 15, wherein the method further comprises:
 detecting an update trigger;
 collecting, in response to detecting the update trigger, new measurement data using the measurement device;
 determining a new impedance value that is associated with the new measurement data; and
 setting the variable impedance device to the new impedance value.

* * * * *